US007653524B2

(12) United States Patent
Li et al.

(10) Patent No.: US 7,653,524 B2
(45) Date of Patent: Jan. 26, 2010

(54) ANALOG AND RADIO FREQUENCY (RF) SYSTEM-LEVEL SIMULATION USING FREQUENCY RELAXATION

(75) Inventors: Xin Li, Pittsburgh, PA (US); Yang Xu, San Diego, CA (US); Peng Li, College Station, TX (US); Lawrence Piileggi, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 370 days.

(21) Appl. No.: 11/208,844

(22) Filed: Aug. 22, 2005

(65) Prior Publication Data
US 2006/0047491 A1 Mar. 2, 2006

Related U.S. Application Data

(60) Provisional application No. 60/604,278, filed on Aug. 25, 2004.

(51) Int. Cl.
*G06F 17/50* (2006.01)
(52) U.S. Cl. ............................................. 703/14; 703/4
(58) Field of Classification Search .................... 703/3, 703/4, 14; 716/4, 12; 331/8; 370/210; 342/169; 710/3
See application file for complete search history.

(56) References Cited

U.S. PATENT DOCUMENTS

| 6,110,217 A * | 8/2000 | Kazmierski et al. ............ 703/14 |
| 6,266,630 B1 * | 7/2001 | Garcia-Sabiro et al. ....... 703/14 |
| 6,360,283 B1 * | 3/2002 | Houldsworth ................... 710/3 |
| 6,498,583 B1 * | 12/2002 | Tsai et al. ..................... 342/169 |
| 6,820,243 B1 * | 11/2004 | Shey et al. ....................... 716/4 |
| 7,024,652 B1 * | 4/2006 | McGaughy et al. ............ 716/12 |
| 7,304,544 B2 * | 12/2007 | Colleran et al. ................. 331/8 |
| 2002/0123869 A1 * | 9/2002 | Koppl et al. ..................... 703/4 |
| 2003/0046045 A1 * | 3/2003 | Pileggi et al. ................... 703/4 |
| 2004/0141459 A1 * | 7/2004 | Tinker .......................... 370/210 |
| 2004/0153982 A1 * | 8/2004 | Zhang et al. ..................... 716/4 |

OTHER PUBLICATIONS

Asai, H., "Relaxation based simulation of nonlinear circuits in the Frequency domain", IEEE, 1991.*
Asai et al., "Frequency domain latency and relaxation based harmonic analysis of nonlinear circuits", IEEE, 1992.*
Watts et al., "Roomms: A realxation based , object oriented, mixed mode simulator", IEEE, 1990.*

(Continued)

*Primary Examiner*—Paul L Rodriguez
*Assistant Examiner*—Kandasamy Thangavelu
(74) *Attorney, Agent, or Firm*—Withrow & Terranova, P.L.L.C.

(57) ABSTRACT

Analog and radio frequency system-level simulation using frequency relaxation. Embodiments of the invention use a frequency relaxation approach for analog/RF system-level simulation that accommodates both large system size and complex signal space. The simulator can determine an output response for a system by partitioning the system into blocks and simulating the propagation of an input signal through the blocks. The input signal can take various forms, including a multi-tone sinusoidal signal, a continuous spectra signal, and/or a stochastic signal. Frequency relaxation is applied to produce individual responses. The output response can be computed based on obtaining convergence of the individual responses. The input to embodiments of the simulator can be a circuit netlist, or a block-level macromodel.

24 Claims, 7 Drawing Sheets

OTHER PUBLICATIONS

Ghoniemy et al., "Extended robust semiconductor laser modeling for analog optical link simulations", IEEE 2003.*

Deutsch et al., "A multiprocessor implementation of relaxation based electrical circuit simulation", IEEE 1984.*

Makino et al., "Acceleration techniques for the circuit simulation in the frequency domain", IEEE, 1992.*

Rabbat et al., "A multilevel newton algorithm with macromodeling and latency for the analysis of large scale nonlinear circuits in the time domain", IEEE, 1979.*

Lu et al., "An anlog multi-tone signal generator for built-in0self0test applicatrions", IEEE, 1994.*

Charbon et al., "Modeling digital substrate noise injection in Mixed-signal ICs", IEEE 1999.*

Kundert, K. et al., *Steady-State Methods for Simulating Analog and Microwave Circuits*, Kluwer Academic Publishers, Norwell, MA (1990).

Ruehli, A.E., *Circuit Analysis, Simulation and Design*, Elsevier Science Publishing Co., New York, NY (1987).

Brumbilla, A., et al., "Envelope Following Method for the Transient Analysis of Electrical Circuits," *IEEE Transactions on Circuits and Systems—I*, vol. 47, pp. 999-1008 (Jul. 2000).

Wambacq, P., et al. "Dataflow Simulation of Mixed Signal Communication Circuits Using a Local Multirate, Multicarrier Signal Representation," *IEEE Transactions on Circuits and Systems-I*, vol. 49, pp. 1554-1562. (Nov. 2002).

Varga, Richard S., *Matrix Iterative Analysis*, Prentice-Hall, Englewood Cliffs, NJ (1962).

White, J., et al., *Relaxation Techniques for the Simulation of VLSI Circuits*, Kluwer Academic Publishers, Norwell, MA (1987).

Wambacq, P., et al., "Compact Modeling of Nonlinear Distortion in Analog Communication Circuits," *Proceeding of the IEEE Date Conference*, pp. 350-354 (2000).

Xu, Y., et al., "Noise Macromodel for Radio Frequency Integrated Circuits," *Proceedings of the IEEE Date Conference*, pp. 150-155 (2003).

Sea, R., "An Algebraic Formula for Amplitudes of Intermodulation Products Involving an Arbitrary Number of Frequencies," *Proceedings of the IEEE*, vol. 56, pp. 1388-1389 (Aug. 1968).

Li, X., et al., "Analog and RF Circuit Macromodels for System-Level Analysis," *IEEE DAC*, pp. 478-483 (2003).

Roychowdhury, J., et al., "Cyclostationary Noise Analysis of Large RF Circuits with Multitone Excitations," *IEEE Journal of Solid-State Circuits*, vol. 33, No. 3 (Mar. 1998).

Newton, A., et al., *SPICE3 Version 3f3 User's Manual*, University of California, Berkely, CA (1993).

\* cited by examiner

ANALOG AND RADIO FREQUENCY (RF) SYSTEM-LEVEL SIMULATION USING FREQUENCY RELAXATION

CROSS-REFERENCE TO RELATED APPLICATION

This application claims priority from commonly owned, provisional patent application Ser. No. 60/604,278, filed Aug. 25, 2004, the entire disclosure of which is incorporated herein by reference.

BACKGROUND

The topic of analog circuit simulation has been extensively studied ever since the advent of integrated circuits over three decades ago. Recently, the remarkable evolution of the wireless/personal electronics market has introduced numerous new analog/RF products, as well as new challenges for the simulation of such systems. In order to conquer the increasing difficulties encountered in IC simulation, many advanced techniques; including steady-state analysis and envelope following have been developed. At the same time, the advance of very large scale integration (VLSI) technologies has made it possible to integrate an entire mixed-signal system onto a single chip or within a single electronic package. It is, therefore, important to evaluate the performance of the full mixed-signal system during both top-down design and bottom-up verification.

As IC technologies scale to finer feature sizes and circuit applications move to higher frequency bands, the behavior of analog/RF circuits becomes more complicated and more difficult to understand. Although only a small section of the entire mixed-signal system operates with truly analog signals, the design and verification of the analog components is generally the most challenging. Furthermore, design specifications are not only defined for individual analog/RF circuit blocks, but detailed high-level specifications are described for the entire analog/RF subsystem. For example, an analog front-end in the wireless transceiver is evaluated by several system-level specifications such as ACPR (adjacent channel power ratio). Such specifications require that the analog/RF subsystem is verified independently, as an intermediate stage between circuit-level analysis and mixed-signal system-level simulation.

Figure 1:
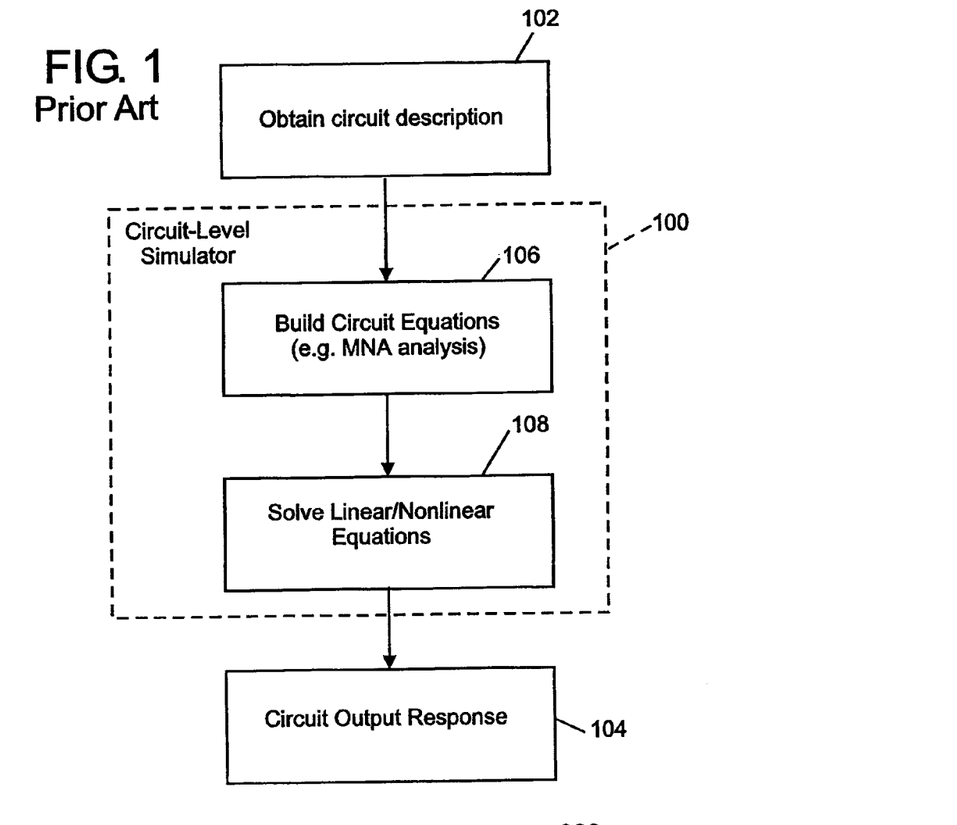
FIG. 1 illustrates the operation of an example circuit simulator that does not employ an embodiment of the present invention.

An example of a simulator that applies circuit-level analysis to a circuit is shown in FIG. 1. Simulator 100 accepts a circuit description that is obtained at process box 102, and produces the output response at process box 104. Such a simulator works by first building equations that describe the overall circuit at process box 106. Often, such a simulator uses modified nodal analysis (MNA) to produce the equations. These equations, which can be both linear and nonlinear, are solved at process box 108.

Unfortunately, directly applying or extending existing simulation techniques to analog/RF system-level analysis suffers from serious limitations. For example, a complete analog/RF system consists of a large number of individual analog circuit blocks. As the system size increases, the traditional algorithms for circuit-level simulation do not accommodate the system-level simulation requirements. Additionally, time-domain transient analysis is effective for analog/digital co-simulation. However, for an analog/RF system, the wide-band input/output signals (e.g. the power spectral density for random noise) are best described by frequency-domain representations, as analyzing an analog/RF system in the time-domain over wide frequency bands can quickly become infeasible.

SUMMARY

Embodiments of the present invention use a frequency relaxation approach for analog/RF system-level simulation that accommodates both large system size and complex signal space. The simulator disclosed in the example embodiments herein can capture various second order effects (e.g. nonlinearity, noise, etc.) for both time-invariant and time-varying (e.g. switching mixer) systems. The simulator operates in the frequency domain and supports wide-band analog input (deterministic) signals (e.g. multi-tone sinusoidal signals) as well as wide-band noise (stochastic) signals. The simulation methodology can include a combination of macromodeling, partitioning, and frequency relaxation.

In example embodiments, the simulator can determine an output response for a system by partitioning the system into a plurality of blocks and simulating the propagation of an input signal through each of the plurality of blocks to produce a description of each of the plurality of blocks. Frequency relaxation is applied to the description for each of the plurality of blocks to produce a plurality of individual responses, at least one for each of the plurality of blocks. The output response is computed based on obtaining convergence of the individual responses.

The input to the simulator of example embodiments of the invention can be a circuit netlist, or a block-level macromodel or their combinations. In at least some embodiments, simulation cost can be reduced by obtaining a block-level macromodel of the analog system, and partitioning the system using the block-level macromodel. Additionally, the total contribution of all noise sources in the system can be represented by injecting noise into the block-level macromodel. The input signal propagated through the various blocks of the system can take various forms, including a multi-tone sinusoidal signal, a continuous spectra signal, and/or a stochastic signal.

In some embodiments, the processes and/or sub-processes of the invention can be carried out with the aid of an instruction execution or processing platform. For example, a partitioning sub-process, an MNA sub-process, a frequency relaxation sub-process, and a convergence sub-process can be implemented as functional blocks of instructions executing within the processing platform. In such an embodiment, the platform in conjunction with a computer program product including computer program instructions can form the means to carry out at least some portions of the processes of the invention.

DETAILED DESCRIPTION OF EXAMPLE EMBODIMENT(S)

The present invention will now be described in terms of specific, example embodiments. It is to be understood that the invention is not limited to the example embodiments disclosed. It should also be understood that not every feature of the devices or sub-process of the methods described are necessary to implement the invention as claimed in any particular one of the appended claims. Various elements, steps, processes, and features of various embodiments of devices and processes are described in order to fully enable the invention. It should also be understood that throughout this disclosure, where a process or method is shown or described, the steps of the method may be performed in any order or simultaneously, unless it is clear from the context that one step depends on another being performed first.

Figure 2:
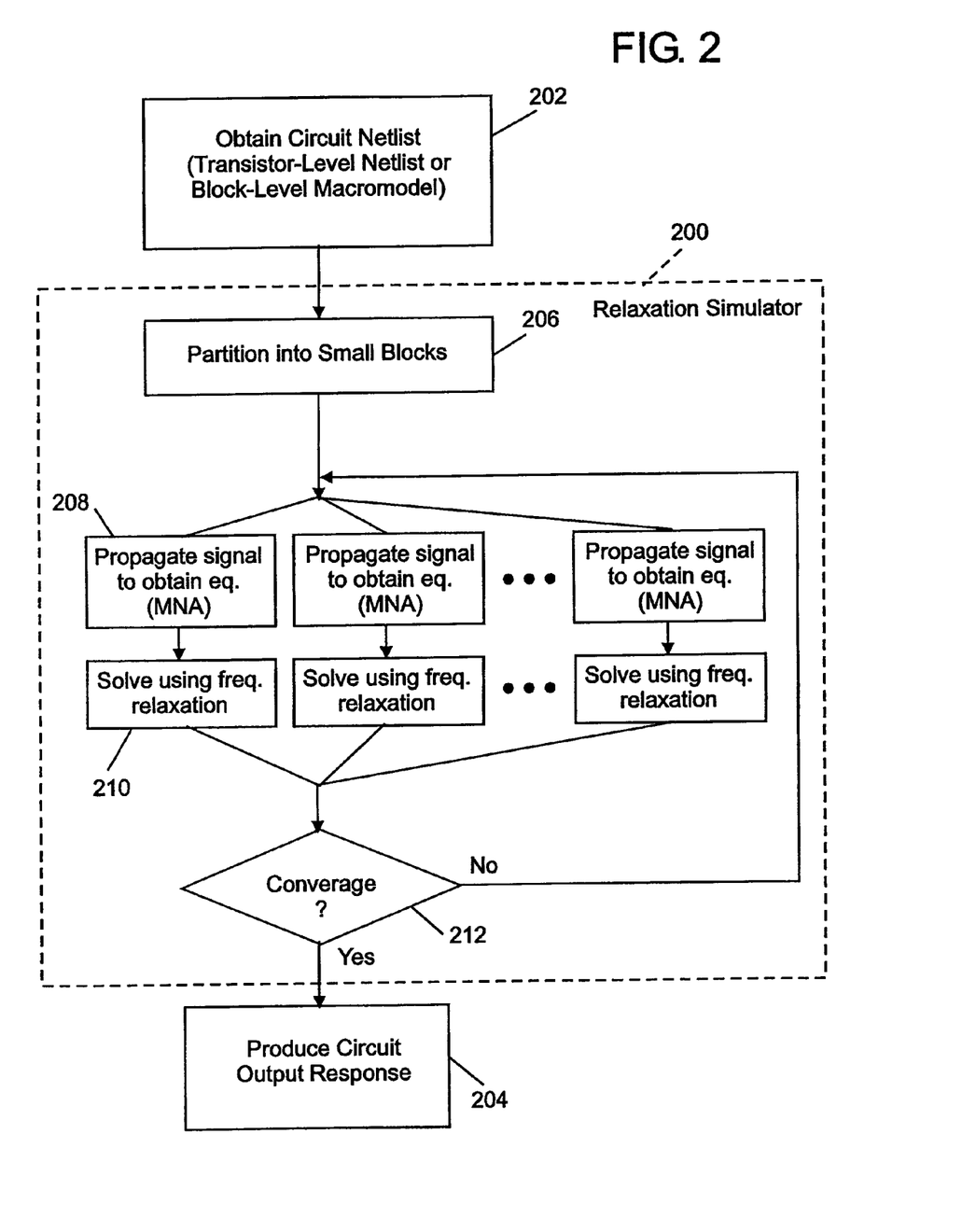
FIG. 2 is a functional block and process flow diagram illustrating the operation of a circuit simulator according to example embodiments of the present invention.

FIG. 2 presents a functional block and process diagram showing an overview of example embodiments of the present invention. Relaxation simulator 200 accepts as input either a transistor-level netlist or a block-level macromodel, or their combinations, which is obtained in process box 202. Simulator 200 produces an output response for the analog system at process box 204. Within simulator 200, the analog circuit or system is partitioned into relatively small blocks at box 206. The sub-processes of boxes 208 and 210 are then performed on a block-by-block basis, as indicated by the multiple process paths with these two process boxes and the ellipsis dots shown in FIG. 2.

Still referring to FIG. 2, at box 208, in this example embodiment, a simulated signal is propagated through the appropriate circuit block and a mathematical description of that circuit block is derived based on the propagation of the signal. In at least some embodiments, this description consists of the circuit equation or circuit equations for the block that are derived using modified nodal analysis (MNA). MNA is a known way of generating circuit equations that involves deriving one equation for each node not attached to a voltage source and you augmenting these equations with an equation for each voltage source. Frequency relaxation is than applied to the description of the block at box 210. In example embodiments, the sub-process of applying the frequency relaxation technique allows the equations to be solved, resulting in a calculated, individual output response for each block. Convergence is tested at process box 212 of FIG. 2, and when the individual output responses converge, the total output response is produced at block 204.

As mentioned above, a simulator according to embodiments of the invention can accept as input, either a transistor-level netlist, or a block-level macromodel, or their combinations. In at least some cases, the use of macromodeling can improve computational efficiency because computational complexity is reduced. A discussion of latency and macromodeling relative to analog system simulation may help the reader to fully appreciate how macromodeling can be of benefit.

Circuit blocks/components, including those that are analog, are generally defined as part of a top-down design methodology. The blocks are designed to be weakly coupled to provide for their independent specification and creation. For analog/RF components there is also a dominant signal flow or propagation direction, which, along with the weak coupling, allows system designers to analyze them using a state-flow type of model.

For example, in a receiver front-end, the RF signal propagates through the low noise amplifier (LNA), mixer, intermediate frequency (IF) amplifier, etc. By proper design, the parasitic coupling between these components is restricted to ensure that each component operates correctly. It follows that any backward signal propagation due to second order effects (e.g. nonideal coupling) is much weaker than the forward propagation. For such simulation models that are characterized by dominant unidirectional signal flow and blocks with high latency, well-known relaxation methods can be applied to exploit these properties. Namely, if the circuit blocks are solved individually in a proper order, a good approximate solution to the entire system is quickly produced after several iterations.

However, in at least some cases, it is not sufficient to explore the latency only among circuit blocks. For numerical simulation, computation cost is determined by the circuit size, as well as the complexity of the signal space for representing the circuit response. An important difference between circuit-level analysis and system-level simulation is that, in system-level simulation, the response signal space is much larger. For example, a wireless transceiver front-end is tested with digitally modulated signals that contain a large number of frequency components and that spread over various (RF, IF and base) frequency bands when passing through the entire transceiver. Such a large signal space has to be completely considered during the simulation of each circuit block. Applying a relaxation approach facilitates the partitioning of a large system into small blocks but, unfortunately, it cannot decompose the signal-response space simultaneously. Therefore, in system-level analysis, it is inefficient, if not impossible, to simulate each circuit block by traditional circuit-level techniques.

A purpose of macromodeling is to extract simple, high-level abstractions that facilitate fast evaluation of nonideal effects in analog/RF circuits. However, from the relaxation point of view, the macromodeling process can also help to break the strong feedback loops inside a circuit that may preclude decomposing the circuit into smaller units. In analog/RF circuit design, feedback techniques are widely used in order to improve the circuit performance. These strong feedback loops are solved during the macromodeling process and the final macromodel can incorporate the closed-loop input-output relation in an explicit form. After macromodeling, a circuit block is further partitioned into much smaller units (e.g. static nonlinear functions and linear transfer functions in macromodels, which can facilitate efficient system level simulation.

Figure 3:
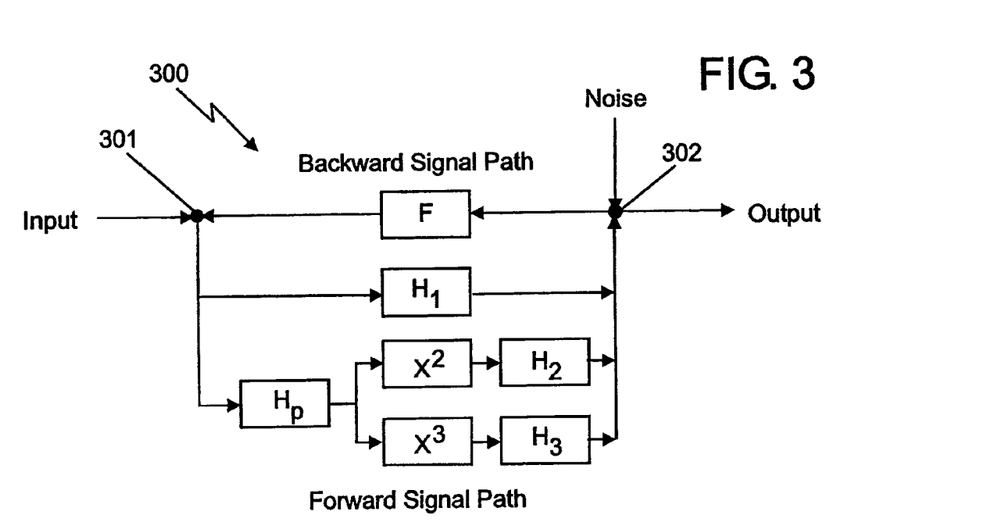
FIG. 3 is an example macromodel of the type that can find use with an embodiment of the present invention.

Shown in FIG. 3 is a typical circuit block macromodel, 300. A macromodeling algorithm approximates the circuit input-output relation by a number of static nonlinear functions, for example, $x^2$, and $x^3$, as well as linear transfer functions, F, $H_P$, $H_1$, $H_2$ and $H_3$. These functions serve to decompose the entire circuit into much smaller units. The static nonlinear functions and linear transfer functions in FIG. 3 are determined by the circuit design of the current stage, the output impedance of the previous stage and the input impedance of the next stage. Due to a variety of nonidealities, signals in a circuit block might not propagate from input to output in an exactly unique direction. The reverse gain is nonzero and should be modeled by the backward signal path, between nodes 301 and 302 as shown in FIG. 3. In addition, with at least some embodiments of the invention, a noise source would be injected at the circuit output, which represents the total contribution of all noise sources (white noise, shot noise, etc.) inside the circuit. Such a noise source can be extracted by macromodeling.

It should be noted that analog/RF systems often include time-varying components such as switching-mixers. These time-varying components bring about several different features. First, the linear transfer functions of the macromodel are not restricted to traditional time-invariant ones. Linear periodically time-varying (LPTV) transfer functions should be applied to describe the input-output behaviors for time-varying circuits according to:

$$H(t, j\omega) = \sum_{n=-\infty}^{\infty} H_n(j\omega) \cdot e^{jn\omega_0 t},$$

where $\omega_0 = 2\pi/T$ and T is the period of the LPTV transfer function. Secondly, due to the time-varying effects, the noise source in FIG. 3 is a cyclostationary process and, therefore, should be characterized by a set of harmonic power spectral densities.

Figure 4:
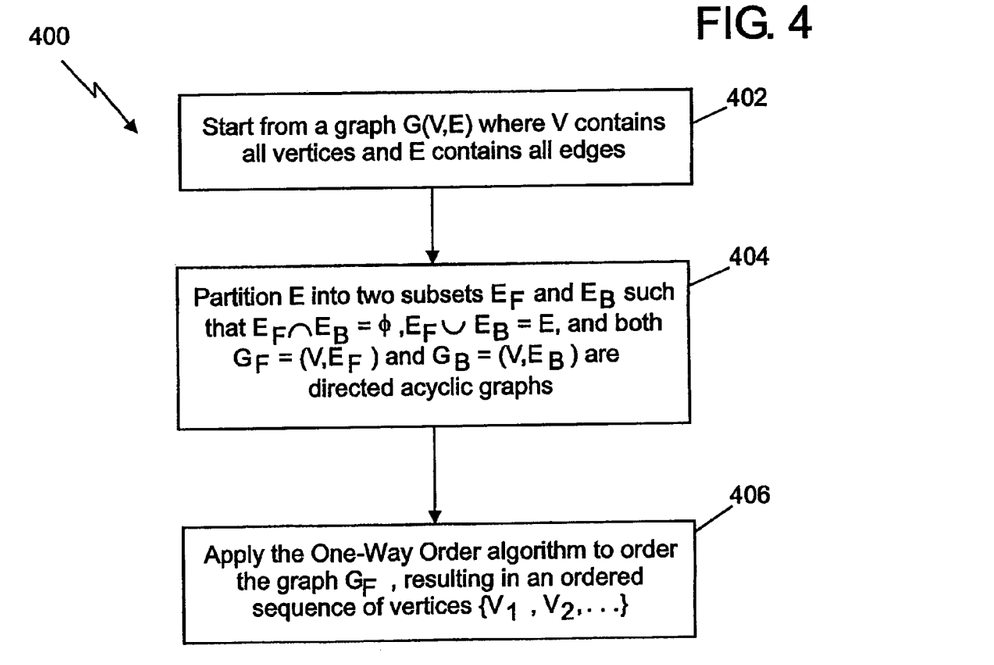
FIG. 4 is a flowchart illustrating a portion of the process of an example embodiment of the present invention.

FIG. 4 is a flowchart that illustrates how an analog circuit or system can be partitioned according to example embodiments of the invention. Like most flowcharts, FIG. 4 as well as the other flowcharts presented herein illustrate processes as a series of process or sub-process boxes. Process 400 starts from process box 402, where a given analog/RF system is converted to a signal flow graph; i.e. a weighted directed graph G=(V,E) without multi-edges and self-loops so that E contains all edges. Each vertex $V_i \epsilon V$ denotes an input, output or internal node, each edge $E_i = [V_m, V_n] \epsilon E$ denotes a signal path from vertex $V_m$ to $V_n$, and the weight of $E_i$ stands for the static nonlinear function, linear transfer function or their combinations associated with the signal path.

Still referring to FIG. 4, at box 404 of FIG. 4, the graph is partitioned into subsets $E_F$ and $E_B$ such that, $E_F \cap E_B = \Phi$, $E_F \cup E_B = E$ and both $G_F = (V, E_F)$ and $G_B = (V, E_B)$ are directed acyclic graphs. It is well known that scheduling the partitioning of the signal flow graph in a proper order can speed up the convergence of a relaxation (e.g. Gauss-Seidel) iteration. Signal flows in an analog/RF system tend to propagate in a unique direction. If the system is solved along the same direction in which signals propagate, a good approximate solution can be reached quickly.

After scheduling, an ordered sequence of vertices $\{V_1, V_2, \ldots, V_N\}$ is obtained at box 406. Either a Gauss-Jacobi or Gauss-Seidel iteration can then be applied for relaxation simulation. In example embodiments, the Gauss-Seidel algorithm is implemented.

Figure 5:
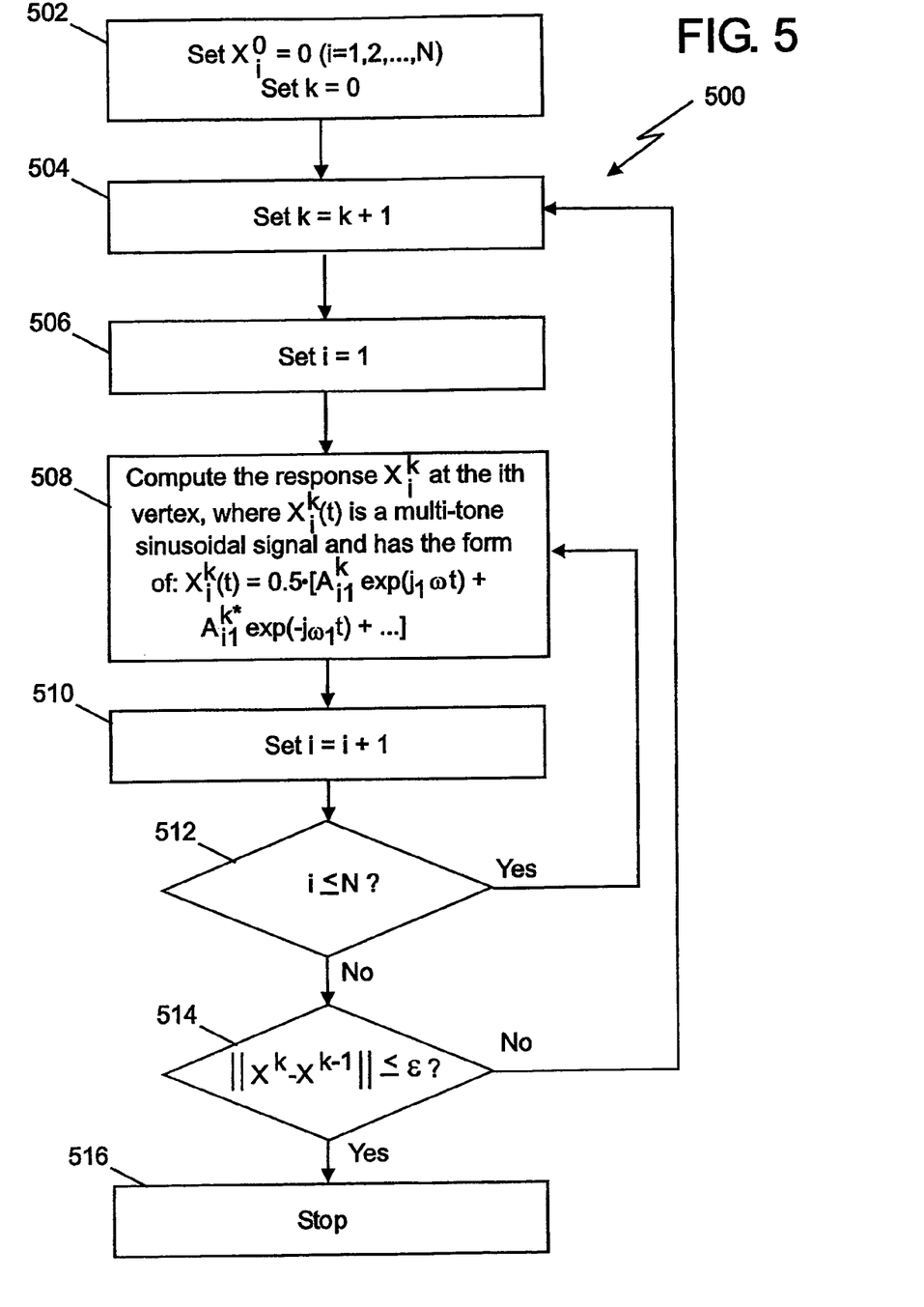
FIG. 5 is a flowchart illustrating at least a portion of the process of an example embodiment of the present invention, wherein a multi-tone sinusoidal signal is used.
Figure 6:
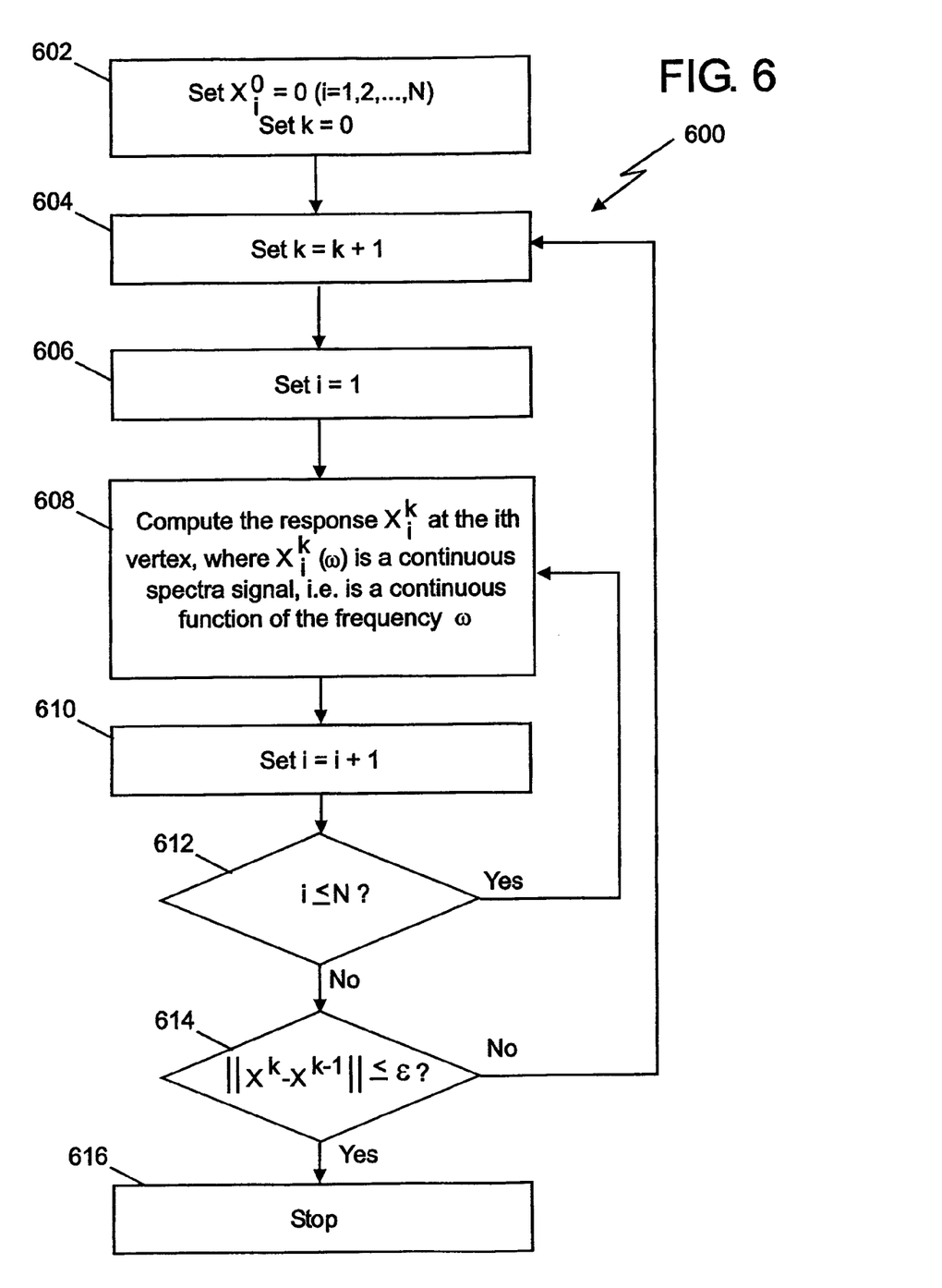
FIG. 6 is a flowchart illustrating at least a portion of the process of an example embodiment of the present invention, wherein a continuous spectra signal is used.
Figure 7:
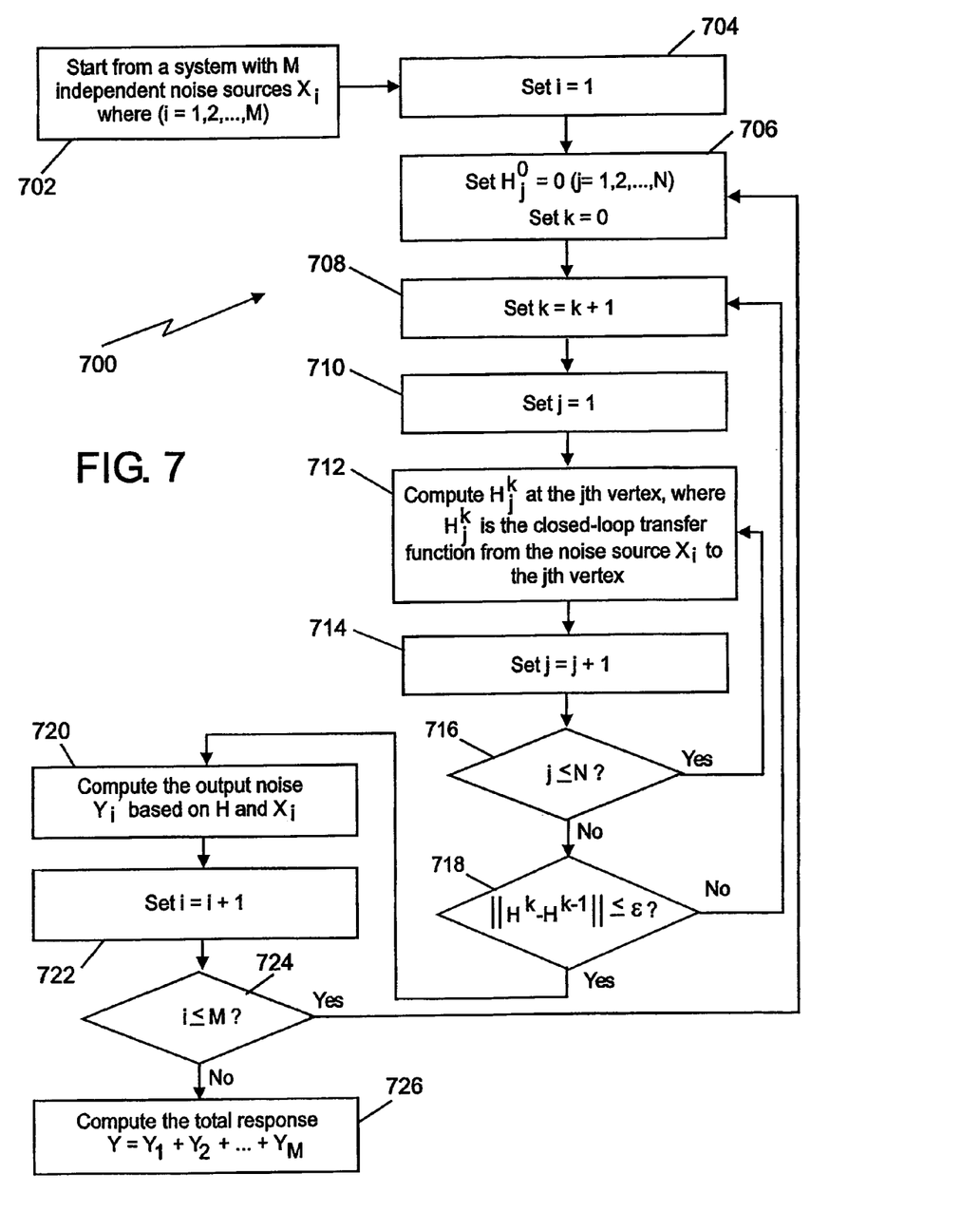
FIG. 7 is a flowchart illustrating at least a portion of the process of an example embodiment of the present invention, wherein a stochastic signal is used.

FIGS. 5, 6, and 7 are flowcharts which describe the propagation, frequency relaxation, and convergence aspects of three example embodiments of the simulator. The signal propagated through an analog/RF system for purposes of these embodiments can be classified into two categories: a deterministic signal (e.g. multi-tone sinusoidal signal) and a stochastic signal (e.g. random noise). FIGS. 5 and 6 describe the process using propagation of deterministic signals.

In the embodiment in the figures, using the macromodel circuit of FIG. 3 as an example, the relaxation simulator first injects the input signal at node 301. After that, the input signal propagates through three different paths $\{H_1\}$, $\{H_P \to x^2 \to H_2\}$ and $\{H_P \to x^3 \to H_3\}$, and all signals from these three paths add together at node 302. Next, the signal at node 302 returns node 301 through the backward path $\{F\}$ and the signal value is further changed at node 301. The relaxation simulator of embodiments of the invention propagates these signals back and forth inside the system. Eventually, if the reverse gain, F, is sufficiently small, all signals in the system become stable after several iterations. The relaxation simulation converges to the solution of the actual system response. As part of the signal propagation, the individual output signals when the input signals pass through basic macromodeling units need to be computed, i.e. static nonlinear functions and linear transfer functions.

FIG. 5 illustrates the process with a multi-tone sinusoidal signal. A multi-tone signal is the sum of a number of sinusoidal terms:

$$x(t) = \frac{1}{2} \cdot \sum_{i=1}^{M} (A_i e^{j\omega_i t} + A_i^* e^{-j\omega_i t}),$$

where $\omega_i > 0$ and $A_i^*$ denotes the conjugate of $A_i$. When the multi-tone signal passes through the static nonlinear block $x^K$, its output response contains various terms of the form:

$$\prod_{i=1}^{M} C_{ai,bi} \cdot (A_i)^{ai} \cdot (A_i^*)^{bi} \cdot e^{j(ai-bi)\omega_i t},$$

where:

$$\sum_{i=1}^{M} (ai + bi) = K \quad (ai \geq 0, bi \geq 0).$$

The coefficient $C_{ai,bi}$ can be computed using combinatorics.

Given a multi-tone input, the output response y(t) of the LPTV transfer function is the sum of the individual responses to all sinusoidal tones, i.e.

$$y(t) = \frac{1}{2} \sum_{i=1}^{M} \sum_{n=-\infty}^{\infty} \left[ \begin{array}{l} A_i H_n(j\omega_i) e^{j(\omega_i + n\omega_0)t} + \\ A_i^* H_n(-j\omega_i) e^{j(-\omega_i + n\omega_0)t} \end{array} \right].$$

Thus, process 500 of FIG. 5 begins at box 502, where $X_i^k(t)$ is set to zero and k=0. k is incremented at box 504, and i set so that i=1 at box 506.

Still referring to FIG. 5, at box 508 of FIG. 5, the function $X_i^k(t)$ is computed at the ith vertex, where the function has the form:

$$X_i^k(t) = 0.5 [A_{i1}{}^k e^{jw_1 t} + A_{i1}{}^{k*} e^{-jw_1 t} + \ldots].$$

At box 510 i is incremented. At box 512, if i has not reached N, processing proceeds to box 514. Otherwise, the computation at box 508 is repeated. At box 514, the truth of the expression:

$$\|X^k - X^{k-1}\| \leq \epsilon,$$

is evaluated. If this condition is met, convergence has been achieved, and processing stops at box 516, otherwise, processing returns to box 504.

FIG. 6 illustrates a process, 600, that is analogous to the process of FIG. 5, except that in this case, a continuous spectra signal is used. A digitally modulated signal has continuous frequency spectra $X(j\omega)$. When $X(j\omega)$ passes through the static nonlinear block $x^K$, its output response $Y(j\omega)$ equals the convolution of $X(j\omega)$ in frequency domain as shown by:

$$Y(j\omega) = \left(\frac{1}{2\pi}\right)^{K-1} \cdot \underbrace{X(j\omega) \otimes X(j\omega) \otimes \ldots \otimes X(j\omega)}_{K}.$$

Otherwise, if X(jω) passes through the LPTV transfer function, the output response Y(jω) can be expressed as:

$$Y(j\omega) = \sum_{n=-\infty}^{\infty} [H_n(j\omega - jn\omega_0)X(j\omega - jn\omega_0)].$$

Thus, still referring to FIG. 6, at box 602, $X_i^k(t)$ is set to zero and k=0. k is incremented at box 604, and i is set to 1 at box 606. At box 608, the response $X_i^k$ where $X_i^k(w)$ is a continuous spectra signal, that is, a continuous function of the frequency ω. At box 610 i is incremented. At box 612, if i has not reached N, processing proceeds to box 614. Otherwise, the computation at box 608 is repeated. At box 614, the truth of the expression:

$$\|X^k - X^{k-1}\| \leq \epsilon,$$

is evaluated. If this condition is met, convergence has been achieved, and processing stops at box 616, otherwise, processing returns to box 604.

As noted previously, either deterministic or stochastic signals can be propagated through the system according to example embodiments of the invention. Due to the time-varying effects in today's analog/RF systems, random noise is described as a cyclostationary stochastic process whose power spectral density is a time-varying function:

$$X(t, j\omega) = \sum_{n=-\infty}^{\infty} [X_n(j\omega) \cdot e^{jn\omega_0 t}],$$

where $X_n(j\omega)$ is the nth harmonic power spectral density of X.

There are differences between deterministic signals and stochastic signals. First, since the amplitude of the physical noise signal is very small, nonlinearities can be ignored for noise analysis. For purposes of the embodiments described herein, only linear transfer functions are considered when studying the propagation of random noise. Secondly, when two stochastic processes A and B are added, their power spectral densities can be added if and only if A and B are uncorrelated. Taking the circuit block of FIG. 3 again as an example, the stochastic noise at node 302 propagates to node 301 through the path {F} and then returns node 302 through {$H_1$}. But, at node 302, the original noise signal and the returning noise signal cannot be added directly, since they come from the same source, thereby making them correlated. At least partly for this reason, process 700 of FIG. 7 is used when a noise signal is propagated for the relaxation technique. At box 702 from a system with M independent noise sources $X_i$ where i=1,2,...,M. At box 704, i is set equal to 1. At box 706, $H_j^0$ as well as k are both set to 0. k is incremented at box 708 and j is set equal to 1 at box 710.

Still referring to FIG. 7, note that instead of propagating the noise signal directly, box 712 "propagates" the transfer function from each noise source to the system output. When several transfer functions are parallel-connected at one node, the overall transfer function is equal to the sum of all individual ones. This implies the fact that transfer functions can be handled as response signals and propagated throughout the system during relaxation iteration. Taking the circuit in FIG. 3 as an example, the transfer function is first initialized from noise source to node 302 as $H_{Noise \to 2} = 1$. Then, $H_{Noise \to 2}$ cascades with F and propagates to node 301 which yields $H_{Noise \to i} = F$. Next, $H_{Noise \to 1}$ cascades with $H_1$, returns node 302 and further changes the value of $H_{Noise \to 2}$. Note that one can ignore the nonlinear signal paths $\{H_P \to x^2 \to H_2\}$ and $\{H_P \to x^3 \to H_3\}$ here. The relaxation simulator repeatedly applies these propagations until the closed-loop transfer functions are obtained from the input to each node of the system. In box 712, $H_j^k$ is computed at the jth vertex, where $H_j^k$ is the closed-loop transfer function from the noise source $X_j$ to the jth vertex.

The above discussion shows that the cascading of different transfer functions can be used with the noise simulation. The following equation gives the overall transfer function H(t,jω) when two LPTV transfer functions F(t,jω) and G(t,jω) are cascaded.

$$H(t, j\omega) = \sum_{n=-\infty}^{\infty} \left\{ \sum_{k=-\infty}^{\infty} [G_{n-k}(j\omega + jk\omega_0)F_k(j\omega)] \cdot e^{jn\omega_0 t} \right\}.$$

After the transfer function H(t,jω) from noise source X(t, jω) to the output is obtained, the nth harmonic power spectral density $Y_n(j\omega)$ at the output can be expressed as a function of the input harmonic power spectral densities $X_k(j\omega)$.

$$Y_n(j\omega) = \sum_{m=-\infty}^{\infty} \sum_{k=-\infty}^{\infty} \left\{ \begin{array}{l} H_m(-j\omega - jm\omega_0) \cdot X_k(j\omega + jm\omega_0) \cdot \\ X_{n-m-k}(j\omega + jm\omega_0 + jk\omega_0) \end{array} \right\}.$$

Studying this equation, one would find that the input noise components at various frequencies {ω+mω₀; m=...,−1,0, 1,...} will mix to the output at frequency ω. In addition, the kth input harmonic component $X_k(j\omega)$ will translate to the nth output harmonic component $Y_n(j\omega)$ These two features are differences between time-varying and time-invariant systems. Compared with the traditional noise simulation approach for LTI systems, the relaxation simulator described herein is capable of accommodating such a noise folding effect involved in many modern analog/RF systems.

Continuing through FIG. 7, at box 714, j is incremented. At box 716, if j has not reached N, processing proceeds to box 718. Otherwise, the computation at box 712 is repeated. At box 718, the truth of the expression:

$$\|H^k - H^{k-1}\| \leq \epsilon,$$

is evaluated. If the condition is not met, processing returns to box 708. If the condition is met, processing proceeds to box 720, where the output noise $Y_i$ is computed based on H and $X_i$. At box 722, i is incremented. At box 724, the condition of i being less than or equal to M is checked. If the condition is met, processing branches back to box 706. Otherwise, convergence has been achieved, and the response, $Y = Y_1 + Y_2 + ... + Y_M$ is computed at box 726.

The convergence sub-process of embodiments of the invention can be readily understood by considering the fact that, without loss of generality, the system equation of a signal flow graph can be written as:

$$X = HX + W,$$

where $X_i$ is the response signal at vertex $V_i$, $W_i$ is the input signal to $V_i$, and $H_{ij}$ is the operator associated with edge $\cap V_j, V_i \cup$. Note that the diagonal elements in matrix H are 0, i.e. $H_{ii} = 0$, since it can be assumed that there are no self-loops in the signal flow graph.

Note that, as discussed with respect to partitioning, after scheduling, an ordered sequence of vertices $\{V_1, V_2, ..., V_N\}$ is obtained. Either the Gauss-Jacobi or Gauss-Seidel iteration can be applied for relaxation simulation. As previously mentioned, the Gauss-Seidel algorithm is implemented in the example embodiments presented herein, since Gauss-Seidel iteration is more efficient (converges more quickly) than the Gauss-Jacobi approach with these embodiments.

In order to study the convergence property of the Gauss-Seidel iteration, we partition the operator matrix H into:

$$H=L+U,$$

where L is a strictly lower triangular operator matrix corresponding to the backward signal paths and U is a strictly upper triangular operator matrix associated with the forward signal paths.

Given a system described by the above equations and operators L and U defined above, it can be shown that the Gauss-Jacobi iteration error is bounded by:

$$|X^{k+1}-X^*|\leq |H|\cdot|X^k-X^*|,$$

and the Gauss-Seidel iteration error is bounded by:

$$|X^{k+1}-X^*|\leq (I-|L|)^{-1}\cdot|U|\cdot|X^k-X^*|.$$

In the equations above, I is the identity matrix and $X^*$ is the exact solution of the system response. The notation $|A|$ denotes a vector/matrix whose elements correspond to the norms of the elements in A, i.e. $|A|_{ij}=|A_{ij}|$. It is easy to verify that $|H|=|L|+|U|$ and $|H|$ is a nonnegative matrix, i.e. all elements in $|H|$ are nonnegative.

Based on the above, the convergence conditions for the Gauss-Jacobi and the Gauss-Seidel iterations are $\rho\{|H|\}<1$ and $\rho\{(I-|L|)^{-1}\cdot|U|\}<1$ respectively, where $\rho\{A\}$ stands for the spectral radius of matrix A. In order to further compare the convergence for these two iteration schemes, one additional theorem is needed from matrix analysis.

The Stein-Rosenberg Theorem states that if $|H|=|L|+|U|$ is a nonnegative matrix with zero diagonal entries, and if the spectral radius $\rho\{|H|\}<1$, then $\rho\{(I-|L|)^{-1}\cdot|U|\}<\rho\{|H|\}<1$. The Stein-Rosenberg theorem suggests an important fact, that since there are no self-loops in the signal flow graph, i.e. $H_{ii}=0$, the Gauss-Seidel iteration is more efficient (converges more quickly) than the Gauss-Jacobi approach in these embodiments of the invention. Furthermore, the Stein-Rosenberg theorem also enables some physical intuition about the convergence. Roughly speaking, Gauss-Seidel iteration converges as long as the signal flow graph for the original analog system does not contain a closed-loop gain larger than 1. It is again worth mentioning that, because of both top-down design methodology and macromodeling technique, signal flows in an analog/RF system almost always propagate in a unique direction and feedback signal paths are very weak. The above convergence analysis provides the theoretical background to explain why the relaxation approach works well for such cases.

Figure 8:
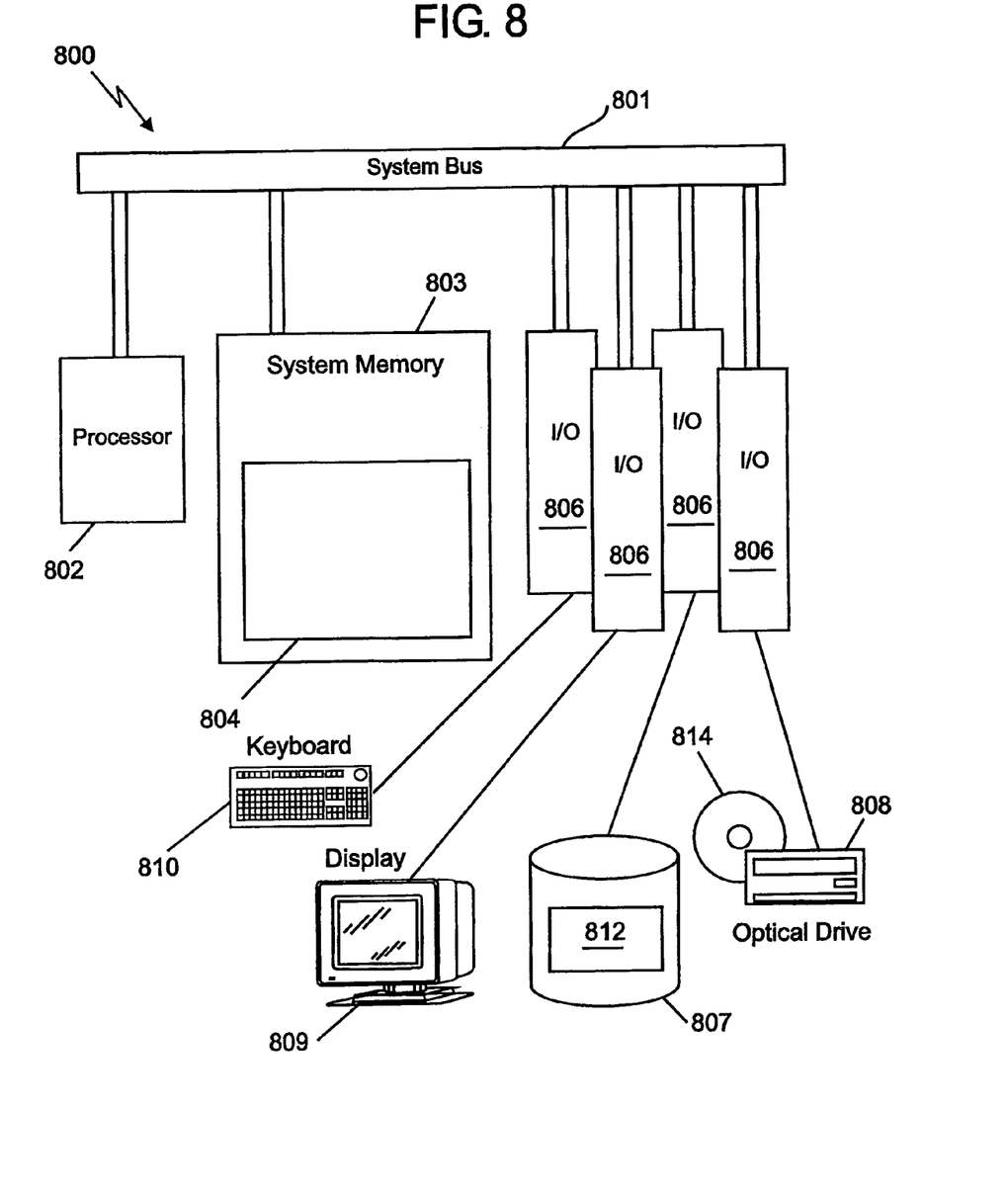
FIG. 8 is a block diagram of an instruction execution system being used to implement an example embodiment of the invention.

It should be apparent that one way to implement the methods of the embodiments of the invention described herein is via computer program instructions running on an appropriate computing platform. FIG. 8 illustrates such a platform. Instruction execution system, 800, that is implementing at least a portion of the invention. System bus 801 interconnects the major components. The system is controlled by processor 802. System memory 803 is typically divided into various regions or types or memory. At least one of those contains some of the computer program code instructions 804 which implement at least portions of the invention. A plurality of input/output (I/O) adapters or devices, 806, are present. These connect to various peripheral devices including fixed, disk drive 807, optical drive 808, display 809, and keyboard 810. One adapter would also typically connect to a network. Computer program code instructions which implement at least some of the functions of the invention can be stored on fixed disk drive 807 as shown by block 812. A computer program product which contains instructions can also be supplied on a media, for example, optical disk 814.

Elements of the invention in fact may be embodied in hardware or software. For example, in addition to taking the form of a computer program product on a medium, the computer program code can be stored in an electronic, magnetic, optical, electromagnetic, infrared, or semiconductor device. Additionally, the computer program may simply be a stream of information being retrieved or downloaded through a network such as the Internet.

Figure 9:
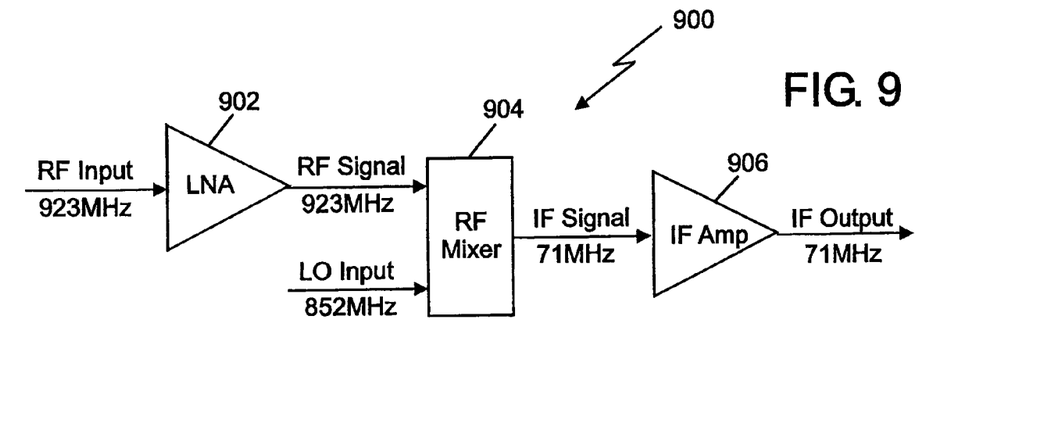
FIG. 9 is a block diagram of an example analog system to which an embodiment of the invention can be applied.

As a specific example of the application of an embodiment of the invention, consider the block diagram of a GSM (Global System for Mobile) receiver system, 900, implemented in 0.25 µm TSMC (Taiwan Semiconductor Manufacturing Company) CMOS process is shown in FIG. 9. A simulator according to embodiments of the invention has actually been applied to the receiver system 900 of FIG. 9. The receiver includes an LNA, 902, an RF mixer, 904, and an IF amplifier, 906. Signal paths are indicated with arrows and frequencies are indicated with appropriate legends. Since traditional algorithms cannot efficiently simulate large systems, using a full GSM receiver would preclude comparison of the simulator of the invention with traditional circuit simulation techniques. However, since the relaxation approach partitions a large problem into a number of small ones, the relative efficiency of the relaxation simulator disclosed herein will be more pronounced as the system size increases.

A macromodel was created for each circuit block containing forward signal paths, as well as backward signal paths due to the nonideal couplings. In this example, the reverse gain for a circuit block was around 20 dB-40 dB less than the forward gain at the center frequency. Next, based on these pre-characterized macromodels, the frequency relaxation simulator was used to simulate the entire system with various input excitations. All the simulations can be performed on a computing platform such as a Sun Sparc™-450 MHz server.

If the input excitation is a single-tone sinusoidal signal in the simulation, due to the nonlinearities, many harmonic components are generated. For comparison, the same macromodel for the GSM receiver was described by Verilog-A and run through a more traditional periodic steady-state (PSS) analysis in SpectreRF with the same error tolerance.

This comparison reveals that the number of iterations required by the relaxation method is more than that by the Newton method in SpectreRF. However, since each relaxation iteration partitions the large system into much smaller units and thereby reduces the computation cost significantly, the relaxation simulator of the invention eventually achieved about 1-2 orders of magnitude of runtime improvement.

In another comparison, a QAM-16 modulated signal was applied to the input port of the GSM receiver. The carrier frequency is 923 MHz. First, the GSM receiver was described by means of a signal flow graph in Matlab Simulink™ and the system was simulated in the time domain. An FFT was applied to the time-domain output waveform. The overall computation time was 73.38 seconds for such a time-domain simulation approach.

If a frequency-domain simulation is run directly with a relaxation simulator according to an embodiment of the invention, the QAM-16 modulated signal is represented by its continuous frequency spectrum with 400 sampling points in the frequency domain. After running continuous frequency spectra simulation for 6.09 seconds, the output frequency spectrum of the GSM receiver system was obtained. In such a comparison, the simulation results from both approaches are nearly identical, while a runtime improvement of more than 11× was achieved by the relaxation simulator of the invention.

Finally, in a noise analysis for the entire GSM receiver system, the noise macromodels for each circuit were extracted by the algorithm discussed herein. After that, cyclostationary noise sources were added at the output port of each circuit block.

During noise simulation, the relaxation simulator first computes time-varying transfer functions from each input noise source to system output. In this example, a time-varying transfer function $H(t,j\omega)$ is represented by a set of harmonic transfer functions up to 7th order, i.e. $\{H_n(j\omega); n=0,\pm 1, \ldots, \pm 7\}$. For relaxation iteration, each $H_n(j\omega)$ is approximated by a piecewise-linear representation with 1000 sampling points in the frequency domain. Next, the output noise value was evaluated based on the harmonic power spectral densities of input noise sources and the computed time-varying transfer functions from each input to output. The overall computation time for noise analysis was 247.78 seconds. Note that, such cyclostationary noise analyses based on macromodels are impractical for existing system-level simulation environments. Therefore, comparison with other methods for the example embodiment using a noise signal is difficult.

Specific embodiments of an invention have been herein described. One of ordinary skill in the circuit design arts will quickly recognize that the invention has numerous other embodiments. The following claims are in no way intended to limit the scope of the invention to the specific embodiments described.

The invention claimed is:

1. A method of operating a simulator to determine an output response of an analog system, the method comprising:
    partitioning the analog system into a plurality of blocks, at least one of the plurality of blocks being non-linear;
    for each block of the plurality of blocks, iteratively simulating propagation of a frequency domain representation of a non-periodic input signal through the block to produce at least one individual non-periodic response for the block until a convergence point has been reached for the at least one individual non-periodic response for the block;
    computing the output response based on the individual non-periodic responses for the plurality of blocks; and
    storing the output response at least temporarily.

2. The method of claim 1 further comprising obtaining a block-level macromodel of the analog system, wherein the partitioning of the analog system is based on the block-level macromodel.

3. The method of claim 2 further comprising representing a total contribution of all noise sources in the analog system by injecting noise into the block-level macromodel.

4. The method of claim 2 wherein the non-periodic input signal comprises a non-periodic multi-tone sinusoidal signal.

5. The method of claim 2 wherein the non-periodic input signal comprises a non-periodic continuous spectra signal.

6. The method of claim 2 wherein the non-periodic input signal comprises a non-periodic stochastic signal.

7. The method of claim 1 wherein the non-periodic input signal comprises a non-periodic multi-tone sinusoidal signal.

8. The method of claim 1 wherein the non-periodic input signal comprises a non-periodic continuous spectra signal.

9. The method of claim 1 wherein the non-periodic input signal comprises a non-periodic stochastic signal.

10. The method of claim 1 wherein the plurality of blocks comprise a time-varying block, and the at least one individual non-periodic response for the time-varying block is time-varying.

11. A computer readable storage medium storing a computer program comprising computer executable instructions for instructing a computing system to:
    partition an analog system into a plurality of blocks, at least one of the plurality of blocks being non-linear;
    for each block of the plurality of blocks, iteratively simulate propagation of a frequency domain representation of a non-periodic input signal through the block to produce at least one individual non-periodic response for the block until a convergence point has been reached for the at least one individual non-periodic response for the block;
    compute an output response of the analog system based on the individual non-periodic responses for the plurality of blocks; and
    store the output response at least temporarily.

12. The computer readable storage medium of claim 11 wherein the computer executable instructions further instruct the computing system to obtain a block-level macromodel of the analog system.

13. The computer readable storage medium of claim 12 wherein the computer executable instructions further instruct the computing system to represent a total contribution of all noise sources in the analog system by injecting noise into the block-level macromodel.

14. The computer readable storage medium of claim 13 wherein the non-periodic input signal comprises at least one of a non-periodic multi-tone sinusoidal signal, a non-periodic continuous spectra signal, and a non-periodic stochastic signal.

15. The computer readable storage medium of claim 12 wherein the non-periodic input signal comprises at least one of a non-periodic multi-tone sinusoidal signal, a non-periodic continuous spectra signal, and a non-periodic stochastic signal.

16. The computer readable storage medium of claim 11 wherein the non-periodic input signal comprises at least one of a non-periodic multi-tone sinusoidal signal, a non-periodic continuous spectra signal, and a non-periodic stochastic signal.

17. The computer readable storage medium of claim 11 wherein the plurality of blocks comprise a time-varying block, and the at least one individual non-periodic response for the time-varying block is time-varying.

18. An apparatus for determining an output response of an analog system, the apparatus comprising:
    means for partitioning the analog system into a plurality of blocks, at least one of the plurality of blocks being non-linear;
    for each block of the plurality of blocks, means for iteratively simulating propagation of a frequency domain representation of a non-periodic input signal through the block to produce at least one individual non-periodic response for the block until a convergence point has been reached for the at least one individual non-periodic response for the block;
    means for computing the output response based on the individual non-periodic responses for the plurality of blocks; and
    means for storing the output response at least temporarily.

19. The apparatus of claim 18 further comprising means for obtaining a block-level macromodel of the analog system.

20. The apparatus of claim 19 further comprising means for representing a total contribution of all noise sources in the analog system by injecting noise into the block-level macromodel.

21. The apparatus of claim 20 wherein the non-periodic input signal comprises at least one of a non-periodic multi-tone sinusoidal signal, a non-periodic continuous spectra signal, and a non-periodic stochastic signal.

22. The apparatus of claim 19 wherein the non-periodic input signal comprises at least one of a non-periodic multitone sinusoidal signal, a non-periodic continuous spectra signal, and a non-periodic stochastic signal.

23. The apparatus of claim 18 wherein the non-periodic input signal comprises at least one of a non-periodic multi-tone sinusoidal signal, a non-periodic continuous spectra signal, and a non-periodic stochastic signal.

24. The apparatus of claim 18 wherein the plurality of blocks comprise a time-varying block, and the at least one individual non-periodic response for the time-varying block is time-varying.

* * * * *